United States Patent
Wang et al.

(10) Patent No.: US 10,715,361 B1
(45) Date of Patent: Jul. 14, 2020

(54) DELAY COMPENSATION USING BROADBAND GAIN EQUALIZER

(71) Applicant: Analog Devices International Unlimited Company, Limerick (IE)

(72) Inventors: Xudong Wang, Colorado Springs, CO (US); William B. Beckwith, Larkspur, CO (US); Michael W. Bagwell, Colorado Springs, CO (US); Thomas E. Schiltz, Colorado Springs, CO (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/534,906

(22) Filed: Aug. 7, 2019

(51) Int. Cl.
- *H04L 25/03* (2006.01)
- *H03H 7/24* (2006.01)
- *H03H 7/18* (2006.01)

(52) U.S. Cl.
CPC ......... *H04L 25/03878* (2013.01); *H03H 7/18* (2013.01); *H03H 7/24* (2013.01)

(58) Field of Classification Search
CPC ....... H04L 25/03878; H03H 7/24; H03H 7/18
See application file for complete search history.

(56) References Cited

U.S. PATENT DOCUMENTS

| 3,518,581 | A | | 6/1970 | Hughes et al. |
| 4,603,586 | A | * | 8/1986 | IIda ..................... G01S 7/52025 333/138 |
| 4,965,527 | A | | 10/1990 | Clark et al. |
| 4,967,169 | A | | 10/1990 | Sun et al. |
| 5,757,319 | A | * | 5/1998 | Loo ....................... H01Q 3/2605 342/375 |
| 6,563,629 | B2 | | 5/2003 | Ghera et al. |
| 6,636,657 | B1 | | 10/2003 | Aksyuk et al. |

(Continued)

FOREIGN PATENT DOCUMENTS

CN 109039288 A 12/2018

OTHER PUBLICATIONS

Itoh, Yasushi, et al., "L-Band SiGe HBT Active Differential Equalizers with Varactor-Tuned Bias Circuits for Variable, Positive or Negative Gain Slopes", Contemporary Engineering Sciences, 9(15), (Jul. 10, 2016), 7 pgs.

(Continued)

*Primary Examiner* — Siu M Lee
(74) *Attorney, Agent, or Firm* — Schwegman Lundberg & Woessner, P.A.

(57) ABSTRACT

An electronic circuit can include a gain adjustment circuit (e.g., a gain "equalizer" circuit), such as to compensate for a variation in insertion loss over a specified range of frequencies. For example, such a gain adjustment circuit can provide an insertion loss characteristic having a specified slope. Such a slope can include a positive slope where insertion loss increases with respect to frequency, or a negative slope where insertion loss decreases with respect to frequency, as illustrative examples. A gain equalization technique can be used to compensate for variation in insertion loss versus frequency between different circuit paths, such as in relation to a switchable delay line having two or more selectable paths, such as for phase shifting applications. A gain adjustment circuit can be configured to provide relatively flat or constant time-domain delay versus frequency, such as inhibiting or reducing dispersion.

22 Claims, 8 Drawing Sheets

(56) References Cited

U.S. PATENT DOCUMENTS

| | | |
|---|---|---|
| 6,747,774 B2 | 6/2004 | Kelly et al. |
| 7,359,112 B2 | 4/2008 | Nishihara et al. |
| 8,064,508 B1 | 11/2011 | Lee |
| 8,095,098 B2 | 1/2012 | Brooks et al. |
| 8,561,125 B2 | 10/2013 | Shafer et al. |
| 9,729,358 B2 | 8/2017 | Ziv |
| 2002/0157117 A1 | 10/2002 | Geil et al. |
| 2002/0186098 A1* | 12/2002 | Sayyah ............... H03H 11/20 333/156 |
| 2011/0187481 A1 | 8/2011 | Alkan et al. |
| 2017/0063593 A1* | 3/2017 | Bonebright ......... H04L 27/2647 |

OTHER PUBLICATIONS

Kim, Jinhyun, et al., "CMOS true-time delay IC for wideband phased-array antenna", Wiley ETRI Journal, 40(6), (2018), 6 pgs.

* cited by examiner

DELAY COMPENSATION USING BROADBAND GAIN EQUALIZER

FIELD OF THE DISCLOSURE

This document pertains generally, but not by way of limitation, to apparatus and techniques that can be used for processing electrical signals in the analog domain, and more particularly, to one or more of filtering or delaying electrical signals in a controlled manner.

BACKGROUND

Electronic circuits can be used to process time-varying electrical signals. In radar or satellite communication system, operating frequencies may generally extend beyond about 1 gigahertz (GHz), and such an operating frequency range can be referred to as a microwave range of frequencies. Interconnects or other structures can exhibit "transmission line" behavior at such operating frequencies. A transmission line structure can be defined as an electrical structure where the physical dimensions of the structure are comparable to or greater than a wavelength of a signal being conveyed by the transmission line structure. For example, structures that have physical dimensions (such as length) that are comparable to at least a tenth of a wavelength, at least a quarter of a wavelength, at least a half of a wavelength, or greater in extent, can be referred to as exhibiting transmission line characteristics. Various electrical effects can occur or can become more significant as operating frequency increases. For example, interconnects or passive components may exhibit enhanced losses as frequency increases. Such losses can be associated with a skin effect behavior, or other effects such as frequency-dependent parasitic behavior or frequency-dependent loss (e.g., conductive or dielectric losses). Distortion of pulses or other waveforms can occur when insertion loss or other propagation characteristics vary with respect to frequency.

SUMMARY OF THE DISCLOSURE

Electronic circuits described herein can be used for processing electrical signals, such as for applications involving time-varying signals in the radio frequency (RF) or microwave ranges of frequencies. For example, an electronic circuit as described herein can provide a controllable delay duration, such as to provide a phase-shifting function. The present inventors have recognized, among other things, that electronic circuits such as phase-shifting circuits (e.g., using delay lines), power combiners, couplers, attenuators, or other circuits, can exhibit unwanted effects when operated at microwave frequencies. Such effects can become more challenging when a wide range of frequencies is used. For example, in one approach, "narrow" bandwidth or "narrowband" structures can be used such as operable in a frequency range spanning one megahertz (MHz), 10 MHz, or 100 MHz, as illustrative examples. Such a narrowband range of frequency can be centered around a higher frequency, such as around 1 gigahertz (GHz) or around 5 GHz, as illustrative examples. Effects such as impedance mismatch, time-domain delay, or insertion loss can be relatively stable across such narrowband frequency ranges. By contrast, if a wider operating bandwidth is used, such as spanning ones or tens of gigahertz, insertion loss or other electrical parameters may vary more substantially across such an operating frequency range. Such a wider frequency range can be referred to as "broadband."

In order to address challenges such as variation in loss or other effects, the present inventors have recognized, among other things, that an electronic circuit (such as a "two port" circuit comprising a two-terminal input and a two-terminal output) can include a gain adjustment circuit (e.g., a gain "equalizer" circuit), such as to compensate for a variation in insertion loss over a specified range of frequencies. For example, such a gain adjustment circuit can provide an insertion loss characteristic having a specified slope. Such a slope can include a positive slope where insertion loss increases with respect to frequency, or a negative slope where insertion loss decreases with respect to frequency, as illustrative examples. A gain equalization technique can be used to help "flatten" an insert loss versus frequency or to compensate for variation in insertion loss versus frequency between different circuit paths, such as in relation to a switchable delay line having two or more selectable paths (e.g., for phase shifting applications). A gain adjustment circuit can be configured to provide relatively flat or constant time-domain delay versus frequency. Such control of time-domain delay versus frequency can help to reduce dispersion (e.g., pulse distortion) induced by the gain equalization circuit, particularly for broadband applications.

In an example, an electronic circuit can include an adjustable signal delay duration, the electronic circuit comprising a first selectable delay path defining a first delay duration, a second selectable delay path defining a [different] second delay duration, and a gain adjustment circuit (e.g., a gain "equalizer") coupled to at least one of the first selectable delay path or the second selectable delay path to compensate for a difference in insertion loss between the first and second selectable delay paths within a specified range of frequencies. In an example, the first delay duration is longer than the second delay duration. In an example, the gain adjustment circuit comprises a negative-slope gain equalizer circuit located along the second selectable delay path, the negative slope defined as an insertion loss slope versus frequency within the specified range of frequencies.

In an example, an integrated electronic circuit can include an adjustable signal delay duration, the electronic circuit comprising a control circuit, respective selectable delay paths corresponding to different respective delay durations selectable by the control circuit, and at least one gain adjustment circuit coupled to a respective selectable delay path amongst the respective selectable delay paths to compensate for a difference in insertion loss between the respective selectable delay paths within a specified range of frequencies. In an example, respective switch circuits are controllable by the control circuit, the respective switch circuits configured to couple an input node to a selected delay path amongst the respective selectable delay paths and to couple the selected delay path to an output node.

In an example, a technique, such as a method, can include providing an adjustable signal delay duration, including receiving a signal indicative of a selected delay duration, selecting a respective selectable delay path corresponding to the selected delay duration, and compensating for a difference in insertion loss between respective selectable delay paths within a specified range of frequencies using a gain adjustment circuit. In an example, the respective selectable delay paths include a first delay path corresponding to a first delay duration and a second delay path corresponding to a second delay duration that is shorter than the first delay duration.

Generally, the examples described in this document can be implemented in whole or in part within an integrated circuit package or module, such as monolithically integrated.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Demand is increasing for wireless communication services such as facilitated by satellite-based communication systems. Such services can include networking and multimedia serving commercial markets, or broadband high-data-rate communications links in support of aerospace or military needs. A variety of electronic circuits can be used to provide elements in such satellite communication systems, such as including microwave amplifiers or other circuit blocks such as phase shifters or attenuators. For example, certain phased-array applications are being used in broadband applications in the 2 GHz to 20 GHz range or 15 GHz to 50 GHz range, as illustrative examples. Generally, RF or microwave amplifier circuits can exhibit a gain decrease as frequency increases (e.g., due to increasing attenuation or gain "roll-off" behavior). Passive elements such as interconnects or passive components (e.g., resistors, capacitors, or inductors) can also exhibit such a gain variation versus frequency, such as exhibiting increasing insertion loss due to skin effect or dielectric losses, as illustrative examples. Use of a gain adjustment circuit, as shown and described in various examples herein, can help to compensate for such gain variation, such as in broadband applications. For example, such a gain adjustment circuit can be used to provide gain equalization along at least one selectable path provided by an electronic delay circuit.

Figure 1:
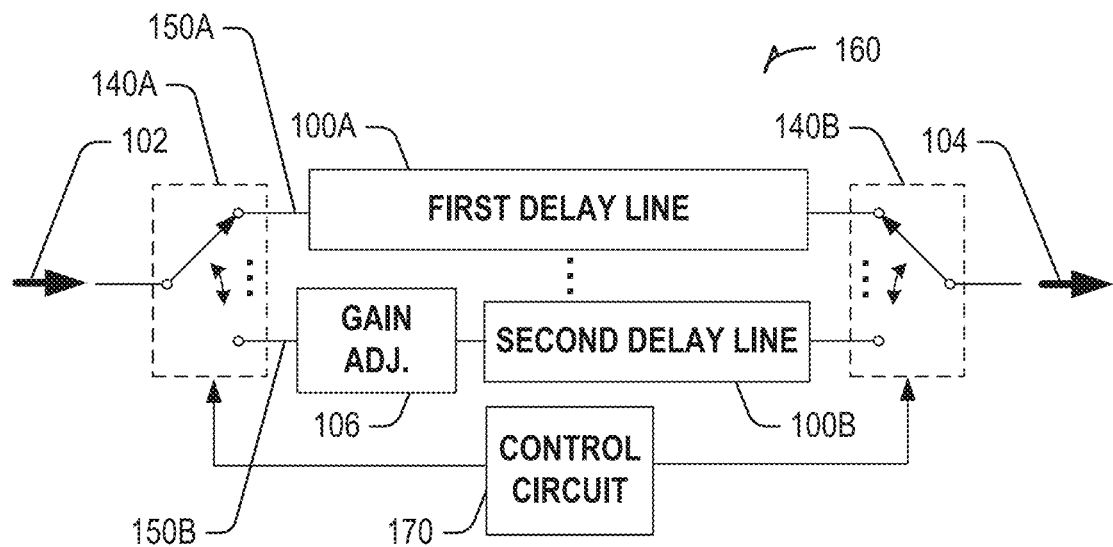
FIG. 1 illustrates generally an example comprising an electronic circuit including two or more selectable delay paths to provide an adjustable signal delay duration.

FIG. 1 illustrates generally an example comprising an electronic circuit 160 including two or more selectable delay paths 150A and 150B to provide an adjustable signal delay duration (e.g., a controllable group delay or phase shift).

Respective switch circuits 140A and 140B can provide a selectable (e.g., controllable) delay duration. For example, a first switch circuit 140A can route the input signal 102 to one of the first or second delay paths 150A or 150B. A second switch circuit 140B can couple a delayed representation of the input signal 102 from either the first or second delay paths 150A or 150B to the output 104. The use of two selectable delay paths 150A and 150B is illustrative, and other counts of delay paths can be used (e.g., three or more delay paths having respective delay durations). The switches 140A and 140B can include single-pole double-throw (SPDT) switches, and the states of the first and second SPDT switches 140A and 140B can be controlled using a control circuit 170. For example, the SPDT switches can include solid-state switching structures (e.g., field-effect transistors or other semiconductor switching devices) or mechanical switches (e.g., MEMS relay devices), and the control circuit 170 can receive a control signal and generate an appropriate drive signal (e.g., a gate drive signal or other signal) to actuate the first or second switches 140A or 140B.

The circuit 160 can provide a broadband phase shifting circuit, such as to receive an input signal 102, and selectively provide an output signal 104 delayed using a first delay line 100A or a second delay line 100B. One or more of the delay lines 100A or 100B can include transmission line structures. The first delay line 100A can provide a relatively longer delay duration (or greater-degreed phase shift) than the second delay line 100B. For example, for a broadband phase-shifting function, the shorter delay line (e.g., second delay line 100B) can be as short as practical because a net phase delay provided by the circuit 160 can be represented as a difference in delay durations provided by the first delay line 100A with respect to the second delay line 100B. In an illustrative example, for a 2 GHz to 18 GHz phase shifting circuit, the longer delay line (e.g., first delay line 100A) may be quite long physically to cover a fraction of a wavelength (e.g., a half of a wavelength) corresponding to the lowest frequency, 2 GHz. When the line is long, the insertion loss generally increases as frequency increases, so such a ½-wavelength line might exhibit one decibel (dB) of insertion loss at 2 GHz and about nine decibels (dB) of insertion loss at 18 GHz, as an illustration. By contrast, in this illustrative example, the relatively shorter delay line (second line 100B) may provide almost constant insertion loss over the same frequency range. Accordingly, the phase shifting circuit will impose different insertion losses versus frequency dependent on which state (e.g., which delay path 150A or 150B) is selected. For example, in the "bypass state" where the shorter delay line 100B is used, the insertion loss will be lower than when the "delay state" where the longer delay line 100A is used.

The present inventors have recognized, among other things, that a gain adjustment circuit 106 can be placed along either or both of the first and second delay paths 150A or 150B. For example, if the gain adjustment circuit 106 is placed in the path 150B with the relatively longer first delay line 100A, the gain adjustment circuit can provide a positive slope gain equalization behavior to flatten the insertion loss. Similarly, if the gain adjustment circuit 106 is placed in a path with a relatively shorter delay line (e.g., delay line 100B), a negative slope gain equalizer can be used, as shown and described in relation to various examples elsewhere herein. The illustration of FIG. 1 shows only a single-ended signal chain, however the topologies and techniques described herein are generally applicable to circuits having a two-node input port and a two-node output port. Such techniques are also generally applicable to balanced or unbalanced topologies.

Figure 2:
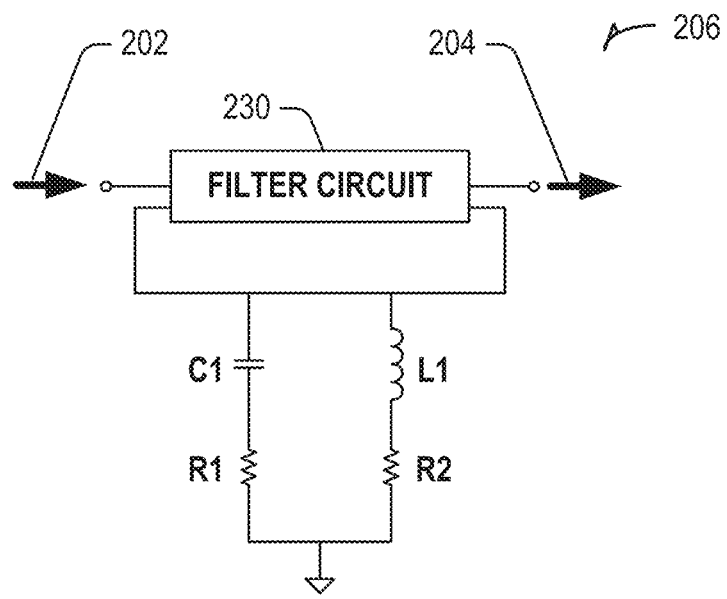
FIG. 2 illustrates generally an example comprising a gain adjustment circuit.

FIG. 2 illustrates generally an example comprising a gain adjustment circuit 206, such as can be used for performing gain equalization in a phase shifting circuit (e.g., the circuit 106 of FIG. 1). The gain adjustment circuit 206 can be defined in part using four parameters, including slope linearity, return loss (e.g., Voltage Standing Wave Ratio), insertion loss, and slope compensation range. Slope linearity can be defined as a deviation (e.g., in logarithmic scale) between a measured gain adjustment circuit 206 insertion loss curve and a line defining a target or "best fit" insertion loss response. Return loss or VSWR can be defined as a measure of how well-matched the impedance provided by the input and output ports of the gain adjustment circuit 206 are with respect to the source (e.g. upstream) or load (e.g., downstream) impedances. For example, if a delay line provides a 50 Ohm characteristic impedance, an ideal gain adjustment circuit 206 will provide a matched 50 ohm output impedance to drive the delay line. Insertion loss can be defined as the absolute value of the loss through the gain adjustment circuit 206, versus frequency, with the highest loss generally occurring at the highest frequency within the operating frequency range. Slope compensation range can be defined as a range of slope values over which the gain adjustment circuit 206 can be used to provide compensation.

In some applications, the gain adjustment network 206 can be structured to provide a linear phase response versus frequency (corresponding to a constant group delay). For example, if the gain adjustment network 206 is used in a phase shifting circuit (e.g., as in the electronic circuit 160 of FIG. 1), a constant group delay can be specified over an entirety of the operating frequency range. Such a constant group delay can help to suppress or inhibit dispersion or other unwanted distortion of signals traversing the gain adjustment circuit 206. The gain adjustment circuit 206 topology shown in FIG. 2 can provide a substantially constant group delay, such as using a topology including a filter circuit 230, along with a termination circuit comprising capacitor C1, inductor L1, and resistors R1 and R2. The filter circuit 230 can include a low-pass topology (e.g., to provide a negative-slope gain adjustment), a high-pass topology (e.g., to provide a positive-slope gain adjustment) or a band-pass topology.

In various examples described herein, such as the illustrative example of FIG. 2, the values of C1 and R1 can be used to adjust an input impedance presented by the gain adjustment circuit 206 to a source, where the source provides an input signal 202. The values of L1 and R2 can be used to adjust a slope of the gain adjustment circuit, such as to provide a gain equalization behavior to compensate for a complementary slope of a delay line insertion loss versus frequency by providing a modified output signal 204. The selection of whether to use a positive-slope gain adjustment circuit or a negative slope gain adjustment circuit can include consideration of issues relating to fabricating integrated circuit elements to provide a portion or an entirety of the gain adjustment circuit. For example, for a broadband gain equalization application including an operating frequency range where the lower frequency defining the range is less than 10 GHz, a negative-slope gain adjustment circuit may be easier to implement as a monolithically-integrated circuit on a semiconductor integrated circuit device as compared to a positive-slope gain adjustment circuit. For example, a high-pass filter element used for the positive-slope gain adjustment circuit may generally consume more area than a low-pass filter element. Illustrative examples of negative-slope and positive-slope gain adjustment circuit topologies are shown illustrative in FIG. 3A and FIG. 3B, respectively.

Figure 3A:
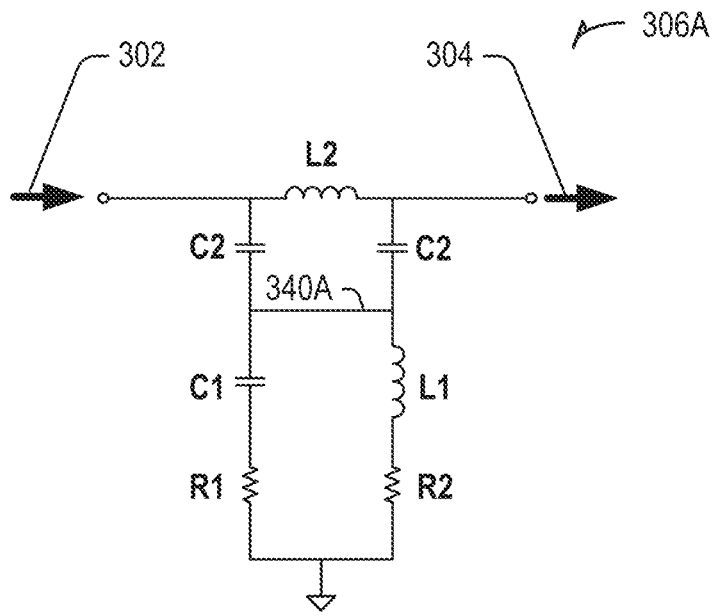
FIG. 3A illustrates generally an example comprising a gain adjustment circuit providing a negative-slope insertion loss across a specified range of frequencies.

FIG. 3A illustrates generally an example comprising a gain adjustment circuit 306A providing a negative-slope insertion loss across a specified range of frequencies. As in the example of FIG. 1, capacitor C1 and resistor R1 can be used in part to adjust an input impedance of the circuit 306A provided to a source of the input signal 302, and inductor L1 and resistor R2 can be used to adjust a gain slope of the circuit 306A. A pi-shaped filter network can used to provide a low-pass configuration, such as including a series inductor L2 and shunt capacitors having value C2, such as a first capacitor coupled between the input node and an intermediate node 340A, and a second capacitor coupled between the output node and the intermediate node 340A. An output signal 304 is provided at the output node.

Figure 3B:
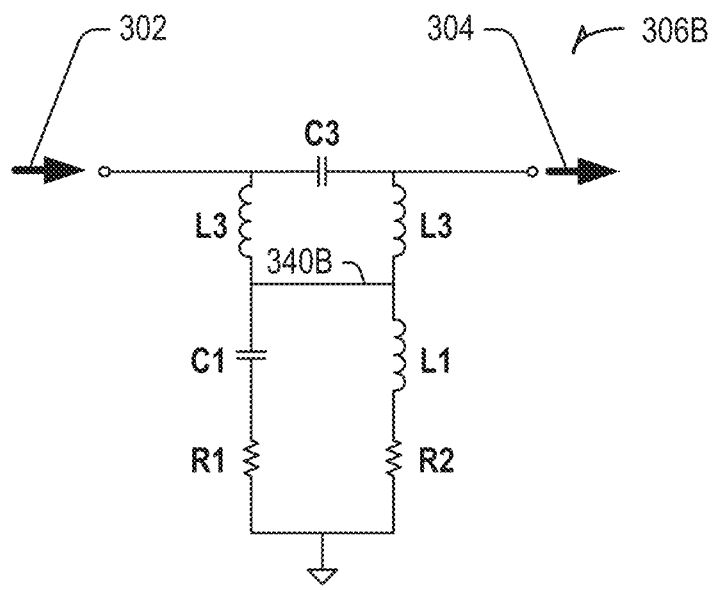
FIG. 3B illustrates generally an example comprising a gain adjustment circuit providing a positive-slope insertion loss across a specified range of frequencies.

FIG. 3B illustrates generally an example comprising a gain adjustment circuit 306B providing a positive-slope insertion loss across a specified range of frequencies. As in the example of FIG. 1, capacitor C1 and resistor R1 can be used in part to adjust an input impedance of the circuit 306B provided to a source of the input signal 302, and inductor L1 and resistor R2 can be used to adjust a gain slope of the circuit 306B. By contrast with the circuit 306A, a high-pass pi-shaped filter configuration is used, having a series capacitor C3, and shunt inductors having value L3 connected between the input node and an intermediate node 340B, and between the output node and the intermediated node 340B, respectively. Use of unbalanced topologies shown in FIG. 3A and FIG. 3B is merely illustratively, and other topologies (e.g., balanced topologies) can be used. The use of pi-shaped filter networks (e.g., including L2, and capacitors having value C2 as shown in FIG. 3A or including C3 and inductors having value L3 as shown in FIG. 3B) is illustrative, and other filter topologies can be used.

Figure 4A:
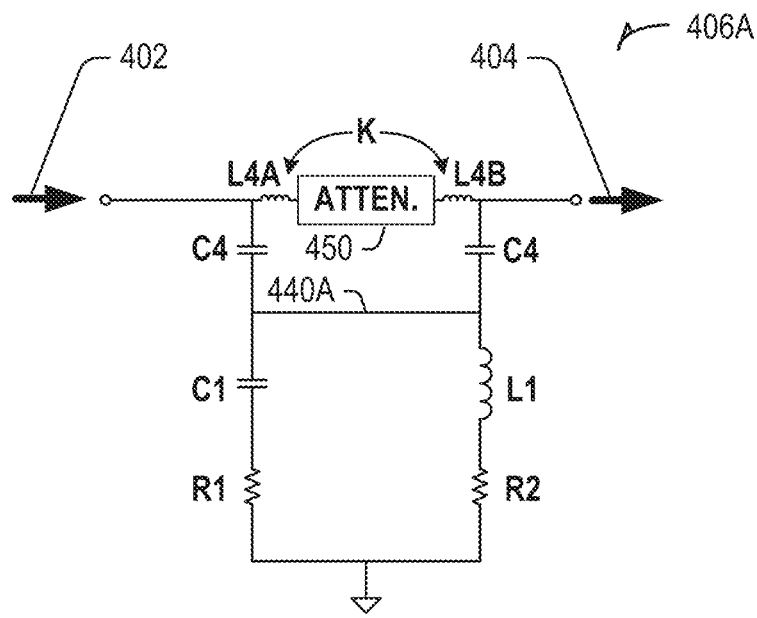
FIG. 4A illustrates generally another example comprising a gain adjustment circuit providing a negative-slope insertion loss across a specified range of frequencies, such as including an attenuator circuit located between mutually-magnetically-coupled inductors.

For example, FIG. 4A illustrates generally another example comprising a gain adjustment circuit 406A providing a negative-slope insertion loss across a specified range of frequencies to receive an input signal 402 and to provide a gain-adjusted output signal 404. The circuit 406A can include a dissipative element (e.g., an attenuator circuit 450) located between mutually-magnetically-coupled inductors L4A and L4B. In FIG. 4A, the negative-slope topology of FIG. 3A is modified by "splitting" the inductor L2 from FIG. 3A into two inductors L4A and L4B. The inductors can, but need not, be mutually-magnetically coupled. For example, two separate inductor structures can be used (corresponding to a coupling coefficient, k=0), or a differential inductor or other coupled inductor structure (e.g., an integrated differential inductor) can be used. If a differential inductor is used, a coupling coefficient of k can range from about 0.5 to 0.9 when such a structure is implemented on or within an integrated circuit. Shunt capacitors having value C4 can be coupled between an input node and an intermediate node 440A, and between an output node and the intermediate node 440A. The attenuator circuit 450 can include one of many different topologies, such as a T-network, a Pi-network, a bridged T-network, an L-network, an O-network, or other circuit, such as formed using resistors.

Figure 4B:
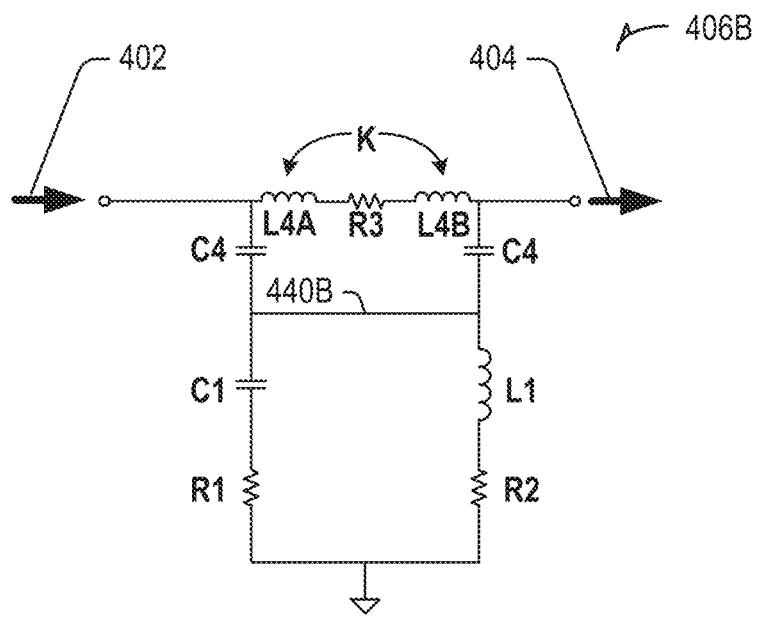
FIG. 4B illustrates generally yet another example comprising a gain adjustment circuit providing a negative-slope insertion loss across a specified range of frequencies, such as including a resistor located between mutually-magnetically-coupled inductors.

FIG. 4B illustrates generally yet another example comprising a gain adjustment circuit 406B providing a negative-slope insertion loss across a specified range of frequencies to receive an input signal 402 and to provide a gain-adjusted output signal 404. In FIG. 4B, a resistor R3 can be located between mutually-magnetically-coupled inductors. As in the example of FIG. 4A, shunt capacitors having value C4 can be coupled between an input node and an intermediate node 440A, and between an output node and the intermediate node 440A. As in the example of FIG. 4A, inductors L4A an L4B can be separate discrete inductors that are not magnetically coupled with other, or such inductors can represent self-inductances provided by mutually-magnetically-coupled inductive elements. In FIG. 4A and FIG. 4B, capacitor C and resistor R1 can be used to provide matching at the input port, and inductor L and resistor R2 can be used to help adjust a slope of the gain versus frequency provided by the circuits 406A or 406B. Generally, in the examples of FIG. 4A and FIG. 4B, inclusion of a dissipative element such as the attenuator circuit 450 of FIG. 4A or the resistor R3 of FIG. 4B can be used to increase an overall insertion loss of the gain adjustment circuits 406A or 406B while maintaining symmetry of the circuit topologies.

Figure 5A:
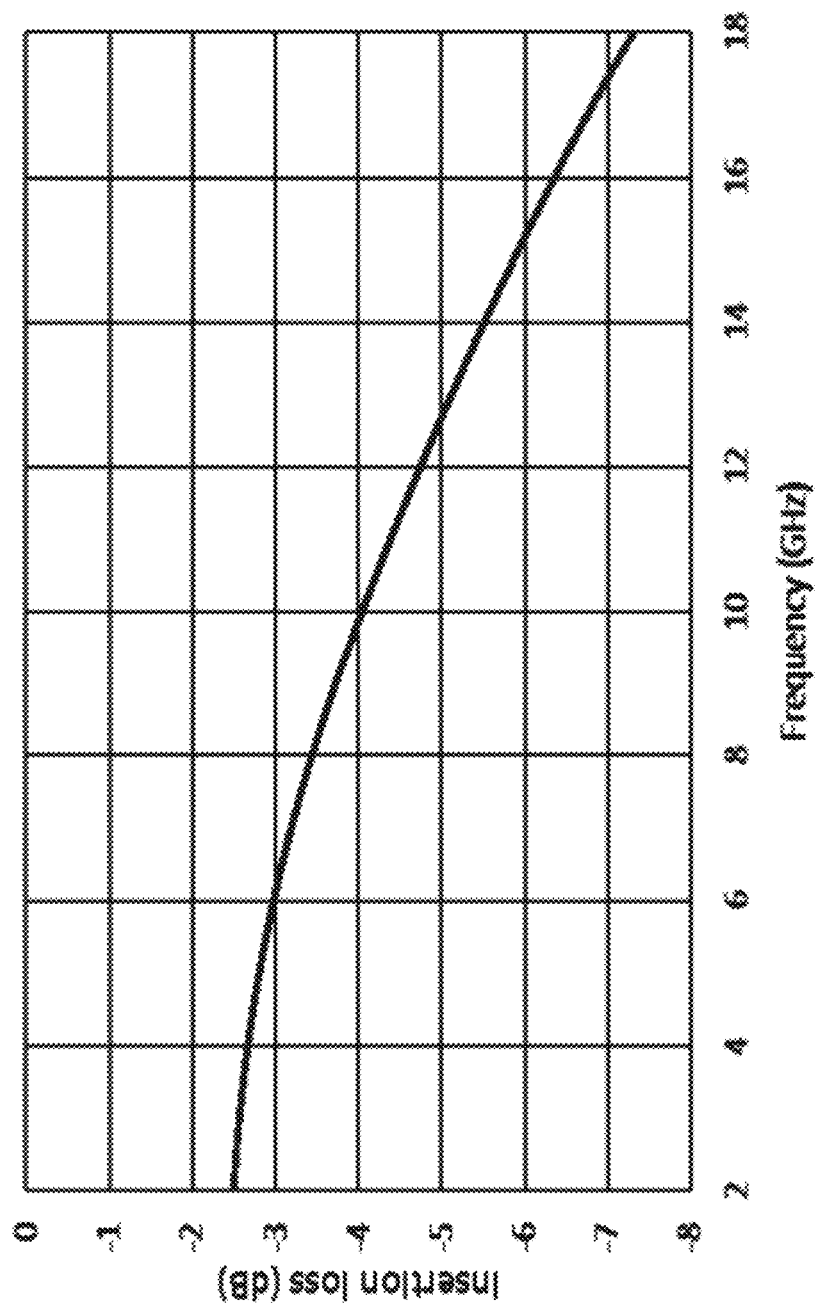
FIG. 5A shows an illustrative example comprising a simulated insertion loss of a gain-equalizer circuit topology similar to the circuit shown in FIG. 4A.
Figure 5B:
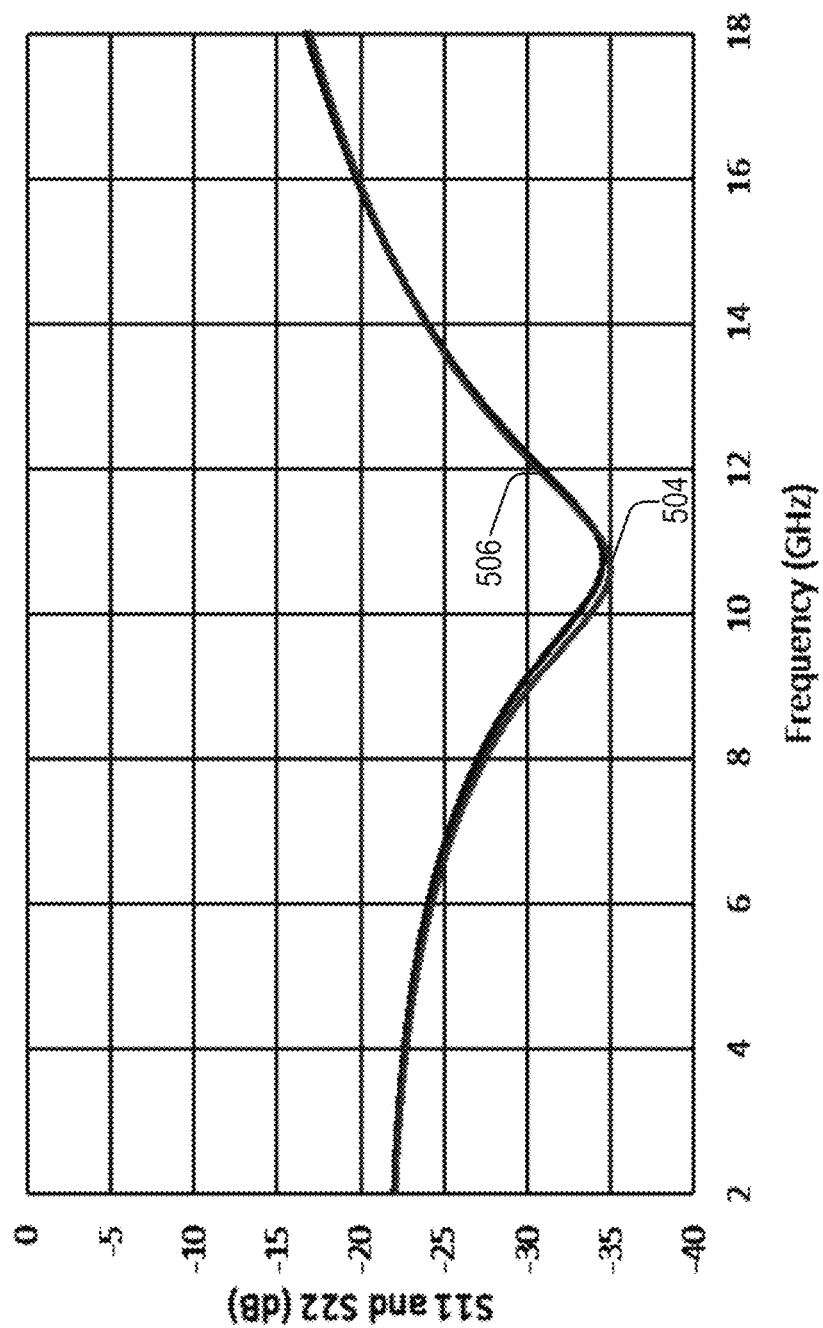
FIG. 5B shows an illustrative example comprising a simulated return loss at each of an input port and an output port of a gain-equalizer circuit topology similar to the circuit shown in FIG. 4A.

FIG. 5A shows an illustrative example comprising a simulated insertion loss of a gain-equalizer circuit topology similar to the circuit shown in FIG. 4A. FIG. 5B shows an illustrative example comprising a simulated return loss at each of an input port (e.g., an S11 parameter 506) and an output port (e.g., an S22 parameter 504) of a gain-equalizer circuit topology similar to the circuit shown in FIG. 4A. Generally, FIG. 5A and FIG. 5B simulate a gain adjustment circuit for gain equalization such as can be paired with a 250 picosecond delay line. In FIG. 5A, the simulated performance shows that 5 dB difference in gain can be provided between 2 GHz and 18 GHz. FIG. 5B illustrates generally that the gain adjustment circuit topology is reasonably well-matched, providing a return loss better (e.g., more negative) than −15 dB, roughly corresponding to a VSWR of 1.4:1 or better.

Figure 6A:
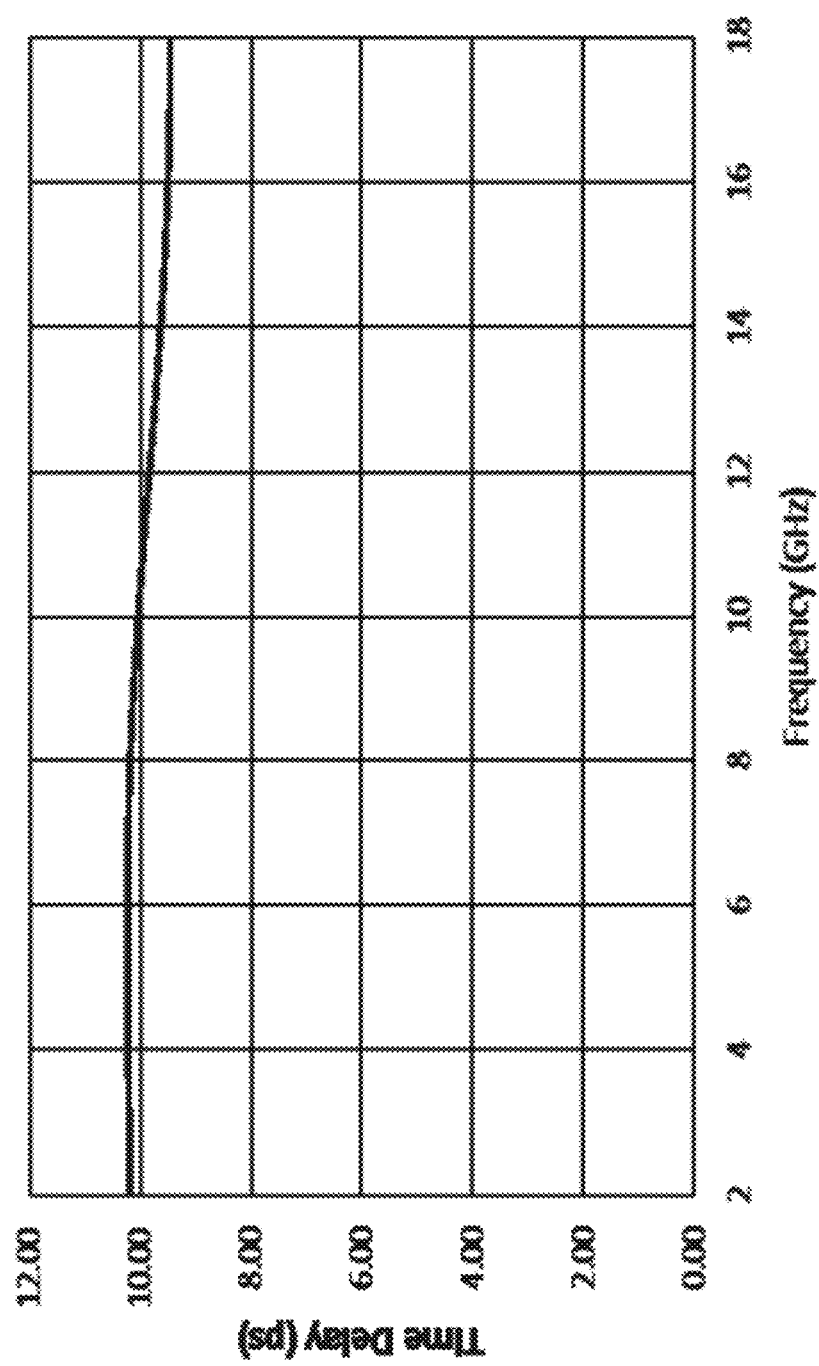
FIG. 6A shows an illustrative example comprising a simulated time delay provided by a gain-equalizer circuit topology similar to the circuit shown in FIG. 4A.

FIG. 6A shows an illustrative example comprising a simulated time delay provided by a gain-equalizer circuit topology similar to the circuit shown in FIG. 4A and illustrates generally that a group delay of the gain adjustment circuit is substantially flat (e.g., constant) over the simulated 2 GHz to 18 GHz operating frequency range, providing less than plus-or-minus 0.35 picoseconds of variation.

Figure 6B:
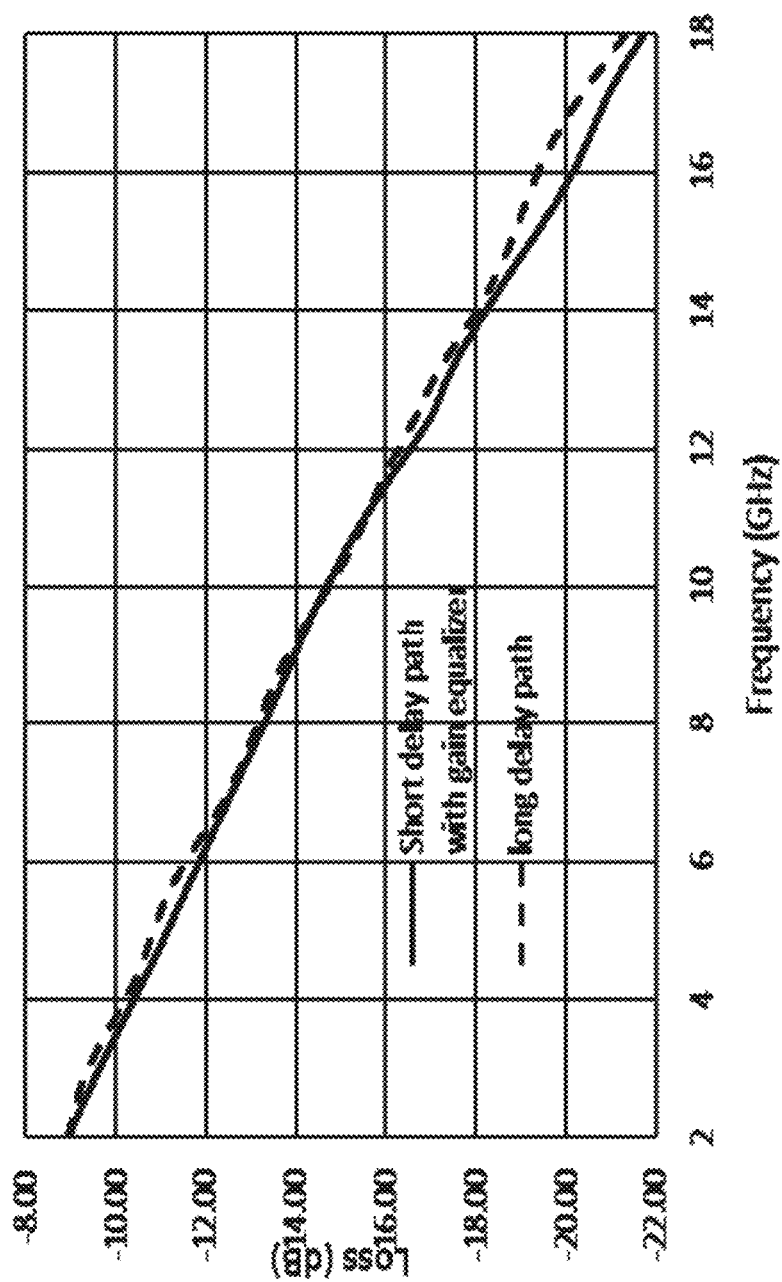
FIG. 6B shows an illustrative example comprising respective simulated insertion losses of a short delay path having a gain equalizer and a correspondingly longer delay path.

FIG. 6B shows an illustrative example comprising respective simulated insertion losses of a short delay path having a gain equalizer and a correspondingly longer delay path. The simulation of FIG. 6B corresponds to a 500 picosecond delay system, such as having a topology similar to FIG. 1, configured to operate over a range of 2 GHz to 18 GHz. As shown in FIG. 6B, the shorter delay path with gain equalization has an insertion loss that has been adjusted to substantially coincide with a corresponding insertion loss of the longer delay path.

Figure 7:
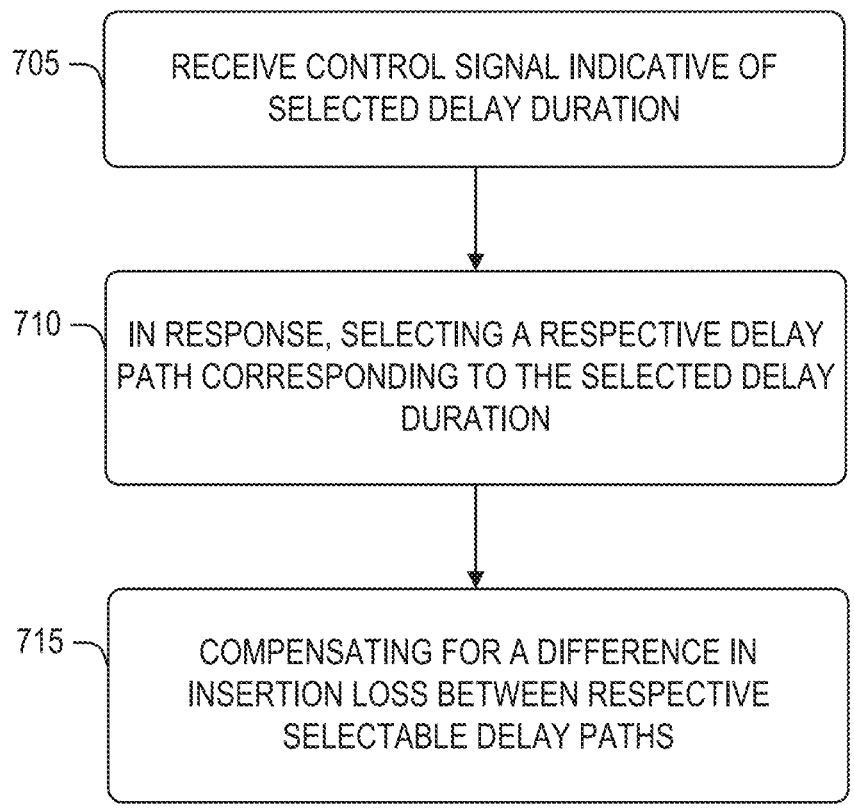
FIG. 7 illustrates generally a technique, such as a method, comprising receiving a control signal indicative of a selected delay duration, and, in response, selecting a respective delay path corresponding to the selected delay duration.

FIG. 7 illustrates generally a technique, such as a method, comprising receiving a control signal indicative of a selected delay duration at 705, and, in response, selecting a respective delay path corresponding to the selected delay duration at 710. The control signal can include a binary-valued signal to change a state of one or more switches (e.g., as shown and described in relation to FIG. 1), or in an example where multiple delay paths are selectable, the control signal can provide information indicative of which delay path or a delay value. The respective selected delay path corresponding to the selected delay duration can have a different insertional loss as compared to one or more other selectable delay paths. At 715, a difference in insertion loss between respective selectable delay paths can be compensated for by using a gain adjustment network, such as to perform gain equalization, as shown and described in relation to other examples herein.

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above The claimed invention is:

1. An electronic circuit include an adjustable signal delay duration, the electronic circuit comprising:
   a first selectable delay path defining a first delay duration;
   a second selectable delay path defining a different second delay duration; and
   a gain adjustment circuit to compensate for a difference in insertion loss between the first and second selectable delay paths within a specified range of frequencies, the gain adjustment circuit comprising at least one of (1) a positive-slope gain equalizer circuit located along the first selectable delay path or (2) a negative-slope gain equalizer located along the second selectable delay path, wherein a slope of the positive-slope equalizer circuit and a slope of the negative-gain equalizer circuit are defined as an insertion loss slope versus frequency within the specified range of frequencies.

2. The electronic circuit of claim 1, wherein the first delay duration is longer than the second delay duration.

3. The electronic circuit of claim 2, wherein the gain adjustment circuit comprises the negative-slope gain equalizer circuit located along the second selectable delay path, the negative slope defined as a negative insertion loss slope versus frequency within the specified range of frequencies.

4. The electronic circuit of claim 3, wherein the negative-slope gain equalizer comprises a pi-shaped network comprising an inductive element in series between an input node and an output node and respective capacitors coupled from the input and output nodes, respectively, to an intermediate node.

5. The electronic circuit of claim 4, wherein the inductive element comprises at least two mutually-magnetically-coupled inductors separated by a dissipative element.

6. The electronic circuit of claim 5, wherein the dissipative element comprises a resistor.

7. The electronic circuit of claim 5, wherein the dissipative element comprises an attenuator circuit.

8. The electronic circuit of claim 2, wherein the gain adjustment circuit comprises the positive-slope gain equalizer circuit located along the first selectable delay path, the positive slope defined as a positive insertion loss slope versus frequency within the specified range of frequencies.

9. The electronic circuit of claim 8, wherein the positive-slope gain equalizer comprises a pi-shaped network comprising a capacitive element in series between an input node and an output node and respective inductive elements coupled from the input and output nodes, respectively, to an intermediate node.

10. An integrated electronic circuit including an adjustable signal delay duration, the electronic circuit comprising:
    a control circuit;
    respective selectable delay paths corresponding to different respective delay durations selectable by the control circuit; and
    at least one gain adjustment circuit coupled to a respective selectable delay path amongst the respective selectable delay paths to compensate for a difference in insertion loss between the respective selectable delay paths within a specified range of frequencies, the at least one gain adjustment circuit comprising a negative-slope gain equalizer circuit or a positive-slope gain equalizer circuit.

11. The integrated electronic circuit of claim 10, comprising respective switch circuits controllable by the control circuit, the respective switch circuits configured to couple an input node to a selected delay path amongst the respective selectable delay paths and to couple the selected delay path to an output node.

12. The integrated electronic circuit of claim 10, wherein the gain adjustment circuit comprises the negative-slope gain equalizer circuit.

13. The integrated electronic circuit of claim 12, wherein the negative-slope gain equalizer circuit comprises a network comprising an inductive element in series between an input node and an output node and respective capacitors coupled from the input and output nodes to an intermediate node.

14. The integrated electronic circuit of claim 13, wherein the inductive element comprises at least two mutually-magnetically-coupled inductors separated by a dissipative element.

15. The integrated electronic circuit of claim 10, wherein the gain adjustment circuit comprises the positive-slope gain equalizer circuit.

16. A method for providing an adjustable signal delay duration, the method comprising:
    receiving a signal indicative of a selected delay duration;
    selecting a respective selectable delay path corresponding to the selected delay duration; and
    compensating for a difference in insertion loss between respective selectable delay paths within a specified range of frequencies using a gain adjustment circuit, the gain adjustment circuit comprising at least one of (1) a positive-slope gain equalizer circuit along one of the selectable delay paths or (2) a negative-slope gain equalizer along one of the selectable delay paths.

17. The method of claim 16, wherein the respective selectable delay paths include a first delay path corresponding to a first delay duration and a second delay path corresponding to a second delay duration that is shorter than the first delay duration.

18. The method of claim 16, wherein the gain adjustment circuit comprises a negative-slope gain equalizer configured to establish a negative slope of insertion loss versus frequency.

19. The method of claim 18, wherein the inductive element comprises at least two mutually-magnetically-coupled inductors separated by a dissipative element.

20. The method of claim 19, wherein the dissipative element comprises a resistor.

21. The method of claim 19, wherein the dissipative element comprises an attenuator circuit.

22. The method of claim 16, wherein the gain adjustment circuit comprises a positive-slope gain equalizer configured to establish a positive slope of insertion loss versus frequency.

* * * * *